US011004820B2

(12) United States Patent
Ng et al.

(10) Patent No.: US 11,004,820 B2
(45) Date of Patent: May 11, 2021

(54) APPARATUS AND METHOD FOR FILLING A BALL GRID ARRAY

(71) Applicant: Aurigin Technology Pte Ltd, Singapore (SG)

(72) Inventors: Boon Chew Ng, Singapore (SG); Ee Teoh Lim, Singapore (SG)

(73) Assignee: Aurigin Technology Pte Ltd, Singapore (SG)

( * ) Notice: Subject to any disclaimer, the term of this patent is extended or adjusted under 35 U.S.C. 154(b) by 0 days.

(21) Appl. No.: 16/474,354

(22) PCT Filed: Feb. 27, 2018

(86) PCT No.: PCT/SG2018/050090
§ 371 (c)(1),
(2) Date: Jun. 27, 2019

(87) PCT Pub. No.: WO2018/160137
PCT Pub. Date: Sep. 7, 2018

(65) Prior Publication Data
US 2020/0194400 A1      Jun. 18, 2020

(30) Foreign Application Priority Data

Mar. 3, 2017   (SG) .......................... 10201701738V

(51) Int. Cl.
*H01L 23/00*      (2006.01)
*B23K 3/06*       (2006.01)
*H01L 21/48*      (2006.01)

(52) U.S. Cl.
CPC .......... *H01L 24/742* (2013.01); *B23K 3/0623* (2013.01); *H01L 21/4853* (2013.01); *H01L 24/11* (2013.01); *H01L 2924/14* (2013.01)

(58) Field of Classification Search
CPC ........................... H01L 24/742; B23K 3/0623
See application file for complete search history.

(56) References Cited

U.S. PATENT DOCUMENTS

| 6,390,351 B1 | 5/2002 | Kasai et al. | |
|---|---|---|---|
| 6,533,160 B1 * | 3/2003 | Bourrieres | .......... H01L 21/4853 228/41 |

(Continued)

FOREIGN PATENT DOCUMENTS

| CN | 102610535 A | 7/2012 |
|---|---|---|
| CN | 104183519 A | 12/2014 |
| WO | 2009102281 A1 | 8/2009 |

OTHER PUBLICATIONS

Intellectual Property Office of Singapore International Search Report dated Apr. 24, 2018 in reference to International Application No. PCT/SG2018/050090.

(Continued)

*Primary Examiner* — Jay C Chang
*Assistant Examiner* — Mikka Liu
(74) *Attorney, Agent, or Firm* — Dinsmore & Shohl, LLP

(57) ABSTRACT

An apparatus and method for filling a ball grid array template and a method for transferring a plurality of balls are disclosed. The apparatus includes a flat base, a plate and a stationary ball supply bin. The plate is mounted on the base and configured to be rotatable about a first axis perpendicular to the base. An upper surface of the plate includes a plurality of holes forming the ball grid array template. The stationary ball supply bin is mounted to the base. The base is configured to be inclined at an angle relative to a horizontal plane. The ball supply bin is configured in use to dispense a plurality of balls onto the corresponding plurality of holes forming the ball grid array template as the plate is rotated about the first axis.

17 Claims, 7 Drawing Sheets

(56) References Cited

U.S. PATENT DOCUMENTS

| | | | |
|---|---|---|---|
| 8,387,236 B2 | 3/2013 | Nebashi et al. | |
| 2003/0127501 A1* | 7/2003 | Cheng | B23K 3/0623 |
| | | | 228/246 |
| 2006/0169743 A1* | 8/2006 | Ng | H01L 24/11 |
| | | | 228/39 |
| 2007/0130764 A1 | 6/2007 | Nebashi et al. | |

OTHER PUBLICATIONS

China National Intellectual Property Administration Office Action dated Sep. 1, 2002 in related Chinese Application No. 2018800047875.

* cited by examiner

APPARATUS AND METHOD FOR FILLING A BALL GRID ARRAY

FIELD OF INVENTION

The present invention generally relates to an apparatus and method for filling a ball grid array template and to a method for transferring a plurality of balls.

BACKGROUND

A ball grid array (BGA) is a type of surface-mount packaging (a chip carrier) used for integrated circuits. BGA packages are used to permanently mount devices such as microprocessors. A BGA can provide more interconnection pins than can be put on a dual in-line or flat package.

Typically, in filling a ball grid array template, solder balls are moved into cavities of the template by tilting the template in one direction at a first instance and the template is tilted in the opposite direction in the next instant. The solder balls are moved into the cavities by the action of gravity from the inclination of the template. For example, U.S. Pat. No. 6,390,351 describes a method whereby solder balls are moved by the tilting of platform in a clockwise direction in one instance and then in the reverse direction in the next instance. In the process, the solder balls are moved from cavity to cavity by a blade in coordination with an inclination by a platform. Similarly, in US Patent publication No. US20030127501 A1, solder balls within a bin are moved over a hole array in coordination with the tilting of template. The mechanism is 'rocked' multiple times to enhanced the filling of solder ball into hole array.

In the above examples, solder balls are continually moved together across the surface of the template in different directions. The rubbing between the solder balls and across the template causes a build-up of static charges. The built-up static charges may cause the solder balls to clump together and increase stiction to surfaces of template and blade. Further, the build-up of static charges may cause frequent static discharges through sparking. This increases the rate of oxidation of the solder balls, resulting in poor solderability and electrical connectivity. Therefore, a lower production yield may be possible during operation and also because of the increased risk of damage to solder balls due to pushing 'sticky' balls over the template. Damaged solder balls can cause unequal solder joints which are normally not acceptable during soldering of integrated circuits.

In another example, such as U.S. Pat. No. 8,387,236 B2, a spinning mechanism is used to move solder balls over a template or stencil in various possible paths. These solder balls are continuously being brushed, pushed and moved, causing a lot of rubbing among the solder balls and with the spinning mechanisms and stencil. Static charges will cause stiction of the solder balls to the brushes and stencil surface. This may cause damage to the solder balls especially with smaller ball diameters. With the spinning mechanism comprising multiple brushes, the solder balls are easily trapped either physically or by stiction within this mechanism. This increases the risk of mixing solder balls when it is necessary to change different types of solder balls frequently as needed in semiconductor manufacturing. Mixed solder balls either in diameter or in alloy is not allowed in semiconductor manufacturing as it is considered yield loss. Poor filling of the array of holes in the template may lead to low manufacturing productivity as higher operator intervention is required to rectify malfunctions in the manufacturing process.

Accordingly, a need exists to provide an apparatus that seeks to address some of the above problems.

SUMMARY

According to a first aspect of the present invention, there is provided an apparatus for filling a ball grid array template, the apparatus comprising a flat base; a plate mounted on the base and configured to be rotatable about a first axis perpendicular to the base, an upper surface of the plate comprising a plurality of holes forming the ball grid array template; and a stationary ball supply bin mounted to the base, wherein the base is configured to be inclined at an angle relative to a horizontal plane; and wherein the ball supply bin is configured in use to dispense a plurality of balls onto the corresponding plurality of holes forming the ball grid array template as the plate is rotated about the first axis.

The plate may comprise a first plate member mounted on the base and a second plate member coupled to the first plate member such that the first plate member rotationally drives the second plate member.

The plurality of holes may be disposed on an upper surface of the second plate member.

The angle relative to the horizontal plane may be adjustable based on a size of the balls and a speed of rotation of the plate.

The ball supply bin may comprise an open bottom, and the ball supply bin may be mounted to the base such that the balls in the ball supply bin are in contact with the upper surface of the plate.

The ball supply bin may further comprise a ball gate side wall having a lower end and an upper end, and the ball gate side wall may be pivotable about a second axis adjacent the upper end, the second axis being substantially parallel to the plate.

The ball gate side wall may be configured in use to detect an irregularity during dispensing of the plurality of balls onto the corresponding plurality of holes as the plate is rotated about the first axis.

According to a second aspect of the present invention, there is provided a method for filling a ball grid array template, the method comprising mounting a plate to a flat base inclined at an angle relative to a horizontal plane, wherein an upper surface of the plate comprises a plurality of holes forming the ball grid array template; mounting a stationary ball supply bin to the base such that the ball supply bin is adjacent the upper surface of the plate; and dispensing a plurality of balls from the ball supply bin onto the corresponding plurality of holes forming the ball grid array template while rotating the plate about a first axis perpendicular to the base.

Mounting the plate to the flat base may comprise mounting a first plate member on the base and coupling a second plate member to the first plate member such that the first plate member rotationally drives the second plate member.

The method according to the second aspect may further comprise adjusting the angle relative to the horizontal plane based on a size of the balls and a speed of rotation of the plate.

The method according to the second aspect may further comprise detecting, by the ball gate side wall, an irregularity during dispensing of the plurality of balls onto the corresponding plurality of holes as the plate is rotated about the first axis.

The method according to the second aspect may further comprise providing a vacuum to the plurality of holes for drawing and securing the plurality of balls.

According to a third aspect of the present invention, there is provided a method for transferring a plurality of balls, the method comprising filing a ball grid array template with a plurality of balls using the method as disclosed in the second aspect when the ball grid array template is at a first position; rotating a plate to move the ball grid array template from the first position to a second position; and picking the plurality of balls from the ball grid array template with the ball grid array template being stationary at the second position.

The method according to the third aspect may further comprise tilting the base such that the base is parallel to the horizontal plane at the second position.

The method according to the third aspect may further comprise removing impurities from the plurality of holes of the ball grid array template when the ball grid array template is at a third position.

BRIEF DESCRIPTION OF THE DRAWINGS

Embodiments of the invention will be better understood and readily apparent to one of ordinary skill in the art from the following written description, by way of example only, and in conjunction with the drawings, in which.

DETAILED DESCRIPTION

The following detailed description is merely exemplary in nature and is not intended to limit the invention or the application and uses of the invention. Furthermore, there is no intention to be bound by any theory presented in the preceding background of the invention or the following detailed description. Herein, an apparatus for filling a ball grid array template, method of manufacturing and operating the same are presented in accordance with present embodiments having the advantages of high manufacturing productivity and higher production yield.

Figure 1A:
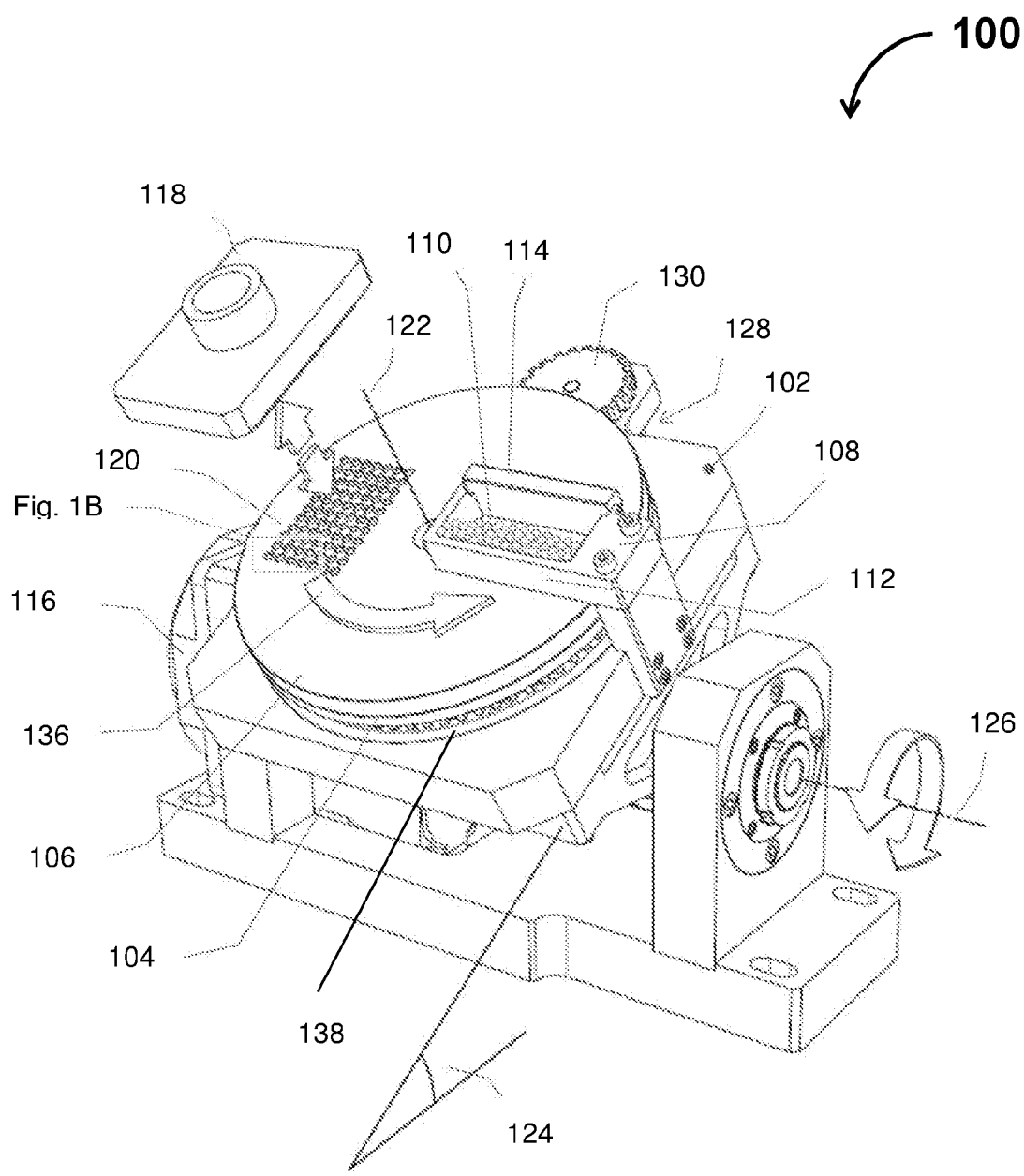
FIG. 1A shows a perspective view of the apparatus for filling a ball grid array template according to an example embodiment.

FIG. 1A shows a perspective view of the apparatus 100 for filling a ball grid array template according to an example embodiment. The apparatus 100 comprises a flat base 102, a plate 106 and a stationary ball supply bin 108. The plate 106 is mounted on the base 102 and configured to be rotatable about a first axis 122 perpendicular to the base 102. The base 102 may be inclined at an angle 124 relative to a horizontal plane by rotating about axis 126. An upper surface of the plate 102 may include a plurality of holes 120 forming the ball grid array template. The ball supply bin 108 is mounted to the base 102 and is configured in use to dispense a plurality of balls 110 onto the corresponding plurality of holes 120 forming the ball grid array template as the plate 106 is rotated about the first axis 122.

The plate 106 further includes a first plate member 138 mounted on the base 102 and a second plate member 104 coupled to the first plate member 138 such that the first plate member 138 rotationally drives the second plate member 104. The plurality of holes 120 are disposed on an upper surface of the second plate member 104. The plate 106 may be rotated about the first axis 122 using a first motor 128 with a gear drive 130. A second motor 116 rotates the base 102 about the axis 126 such that the base 102 is inclined at angle 124 relative to the horizontal plane. In this case, the predetermined angle 124 is approximately 30 degrees. However, it will be appreciated that the angle 124 may be adjusted between 0 and 90 degrees in alternate embodiments. The angle 124 relative to the horizontal plane may be adjustable based on for example, a size of the balls 110 and a speed of rotation of the plate 106.

The ball supply bin 108 may include an open bottom and may be mounted to the base 102 such that the balls 110 in the ball supply bin 108 are in contact with the upper surface of the plate 106. The ball supply bin 108 may further include a ball gate side wall 114 having a lower end and an upper end. The ball gate side wall 114 may be pivotable about a second axis adjacent the upper end, with the second axis being substantially parallel to the plate 106. The sides of the ball supply bin 108 may be circumferentially enclosed such that there are three rigid sides 112 and the fourth side comprises the ball gate side wall 114.

Figure 1B:
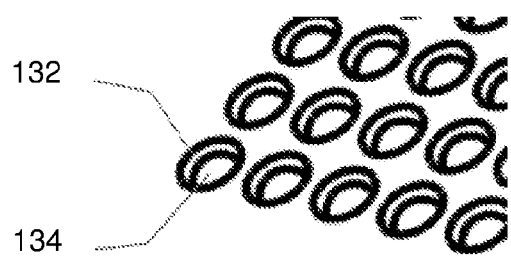
FIG. 1B shows a close-up view of a plurality of holes of the apparatus of FIG. 1A.
Figure 1C:
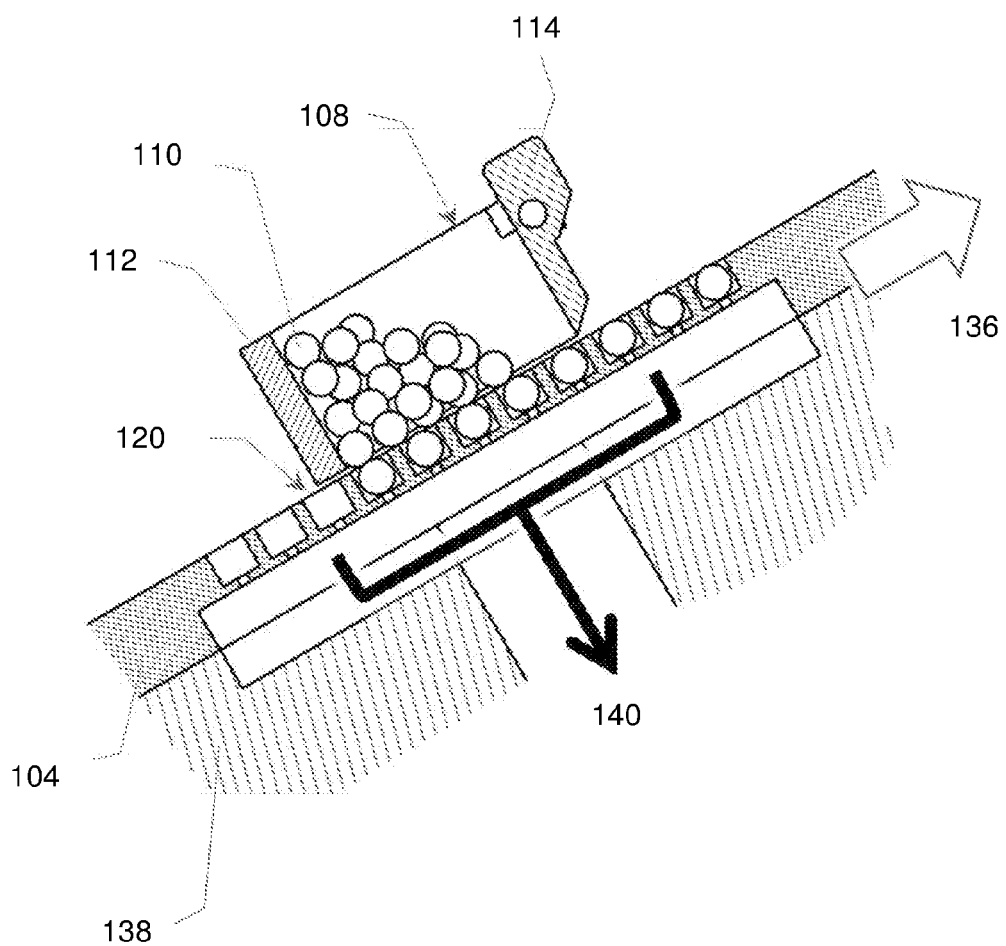
FIG. 1C shows an enlarged cross-sectional view of the apparatus for filling the ball grid array template of FIG. 1A during normal operation according to an example embodiment.
Figure 1D:
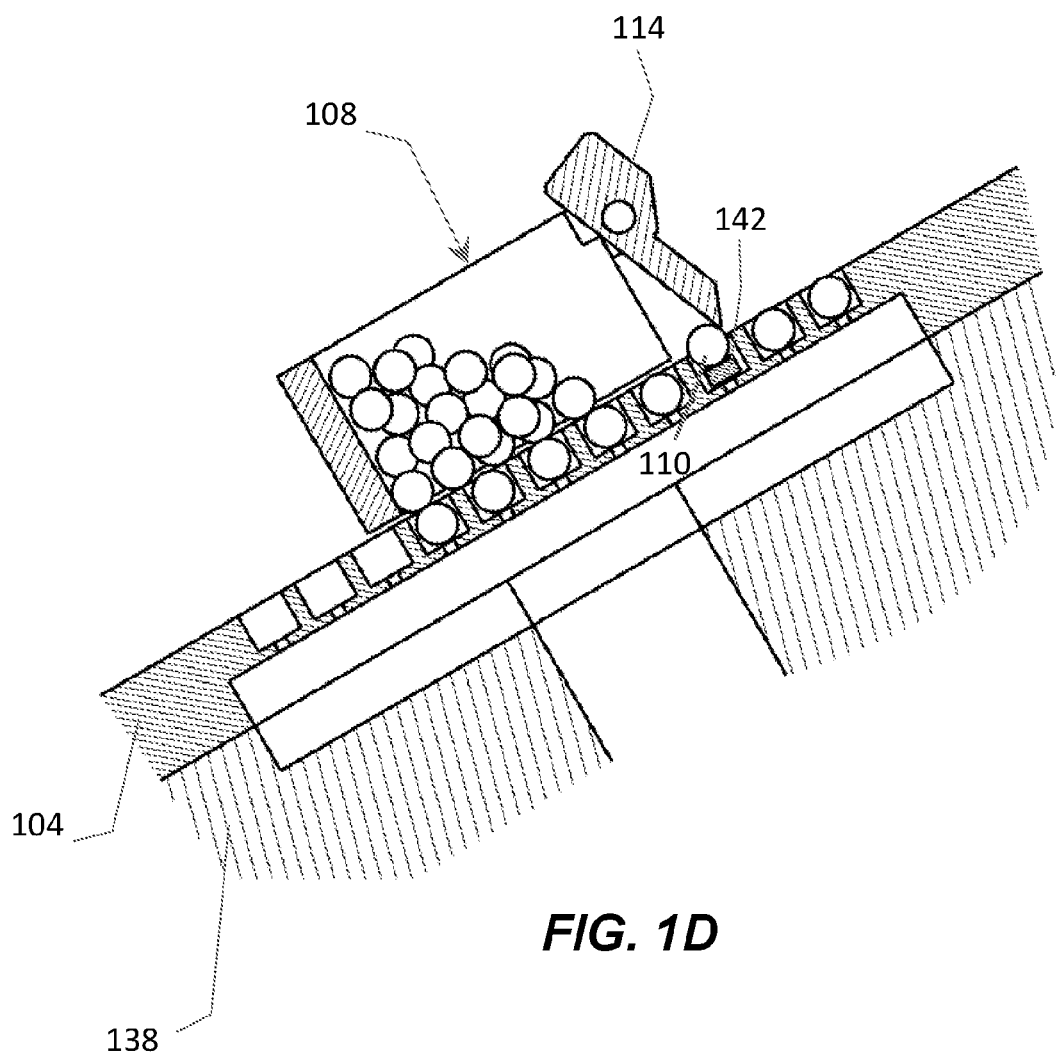
FIG. 1D shows an enlarged cross-sectional view of the apparatus for filling the ball grid array template of FIG. 1A during an irregularity according to an example embodiment.

The ball gate side wall 114 is configured to detect an abnormal situation (e.g. ball protruding out of the hole during the ball filling process). For example, the ball gate side wall 114 may be coupled with a sensor to detect its displacement. FIGS. 1C and 1D show enlarged cross-sectional views of the apparatus 100 for filling the ball grid array template of FIG. 1A during normal operation and during an irregularity, respectively, according to an example embodiment. As shown in FIG. 1C, during normal operation of the apparatus 100, the ball gate side wall 114 is substantially parallel to the rigid side 112 of the ball supply bin 108. Each of the plurality of holes 120 is filled with one ball from the ball supply bin 108. During an abnormal situation as shown in FIG. 1D, the ball 110 protrudes from the hole 120 due to the presence of dirt or impurity 142 in the hole 120. The ball gate side wall 114 contacts the protruding ball 110 and is angularly displaced from its normal position. The sensor can detect the displacement and generate an error signal or alarm causing the operation to be paused for rectification. Advantageously, this may ensure that each hole 120 is accurately filled with a ball.

Before operation, the first plate member 138 of the plate 106 is mounted to the base 102. The base 102 may be attached to a rotary machine. The rotary machine may have a motor 116 to rotate the base 102 about the axis 126 such that the base 102 is inclined at angle 124 relative to the horizontal plane. The second plate member 104 may be coupled to the first plate member 138 such that the first plate member 138 rotationally drives the second plate member 104. The upper surface of the second plate member 104 may be coated with anti-friction or anti-static coatings which provide wear and static protection of the balls 110 during operation of the apparatus 100. The ball supply bin 108 containing the plurality of balls 110 is mounted to the base 102 such that the ball supply bin 108 is adjacent the upper surface of the plate 106. The ball supply bin 108 is mounted to the base 102 such that the ball gate side wall 114 pivots about the second axis being parallel to the plate 106.

The second plate member 104 and the first plate member 138 may be secured together by one or more fasteners. Alternatively, one or more pins may be used to position the first plate member 138 to the base 102 such that they are tightly secured during operation of the apparatus 100. Further, such pins can also be configured such that can be easily secured by the fasteners. Similarly, one or more fasteners can be used to position the ball supply bin 112 such that it is tightly secured to the base 102.

During operation, the base 102 is rotated by the motor 116 about the axis 126 to the predetermined angle 124 to the horizontal plane. The predetermined angle 124 may be calculated based on the size of each of the plurality of balls 110. The predetermined angle 124 is smaller for a larger diameter of each ball and larger for a smaller diameter of each ball. It can be appreciated by the person skilled in the art that the predetermined angle 124 can be up to 90 degrees to facilitate deposition of the balls 110 into the holes 120 of the plate 106. The predetermined angle 124 may also be calculated based on the speed of rotation of the plate 106. The predetermined angle 124 is smaller for a higher speed of rotation and larger for a lower speed of rotation of the plate 106. Advantageously, the rotation of the rotary machine to this position is carried out once in the entire cycle to reduce the amount of agitation to the balls 110. At this position, the plurality of balls 110 are fully resting on a rigid side wall 112 of the ball supply bin 108.

Thereafter, the first plate member 104, together with the second plate member 138, are rotated by the first motor 128 and the gear drive 130 about the first axis 122 that is perpendicular to the base 102. The second plate member 138 may include a gear drive to rotate together with the first plate member 104. In other embodiments, a belt drive, a pulley drive or a direct drive can be used in place of the gear drive 130 or the gear drive of the second plate member 138. As shown in FIG. 1A, the plate 106 rotates in the counter clockwise direction 136. The ball supply bin 108, attached to the base 102, remains stationary as the plate 106 rotates. At the first rotational position of the plate 106, the plurality of holes 120 are positioned below the ball supply bin 108. The plurality of balls 110 from the ball supply bin 108 are dispensed onto the corresponding plurality of holes 120 forming the ball grid array template while the plate 106 is rotated about the first axis 122 perpendicular to the base 102. In an embodiment, vacuum 140 (as shown in FIG. 1C) can be provided to the plurality of holes 120 for drawing and securing the plurality of balls 110 to ensure that the balls 110 are completely dispensed into the holes 120. FIG. 1B shows a close-up view of each of the balls 134 that are deposited into the plurality of holes 120 of the apparatus 100.

In some instances, as the plate 106 rotates about the first axis 122, the lower end of the ball gate side wall 114 may contact any protruding balls that are not filled inside the plurality of holes 120. The ball gate side wall 114 is pivoted into a displaced position to detect an irregularity in the dispensing of the plurality of balls 110 onto the corresponding plurality of holes 120. This may ensure that each of the plurality of holes 120 are filled with one ball as the plate 106 rotates and the holes 120 move away from the ball supply bin 108.

Subsequently, the plate 106 is rotated about the first axis 122 until the filled template is in a pick-up position where the filled balls are picked up by a ball suction tool 118 configured to move in a direction perpendicular to the upper surface of the plate 106. Typically, the ball suction tool 118 is lowered onto the filled ball grid array template and balls 110 can be removed by vacuum or other suction means as understood by a person skilled in the art. The ball suction tool 118 then moves away from the plate 106 and the whole operation is repeated while the base 102 is maintained at the same angle of inclination.

In an alternative embodiment, the base 102 may be tilted such that the base 102 is parallel to the horizontal plane, i.e. the angle 124 of FIG. 1A is at 0 degrees prior to the balls being picked up. Such a situation arises when the apparatus may be integrated into existing machines or the ball suction tool 118 can only move in a vertical direction to pick up the solder balls 134 from the ball grid array template. In such an embodiment, the plurality of balls 110 are directly below a ball suction tool 118 at the pick up position. The ball suction tool 118 is lowered to the plate 106 so that the ball suction tool 118 and balls 110 that are dispensed in the holes 120 are then picked up by the ball suction tool 118.

Figure 1E:
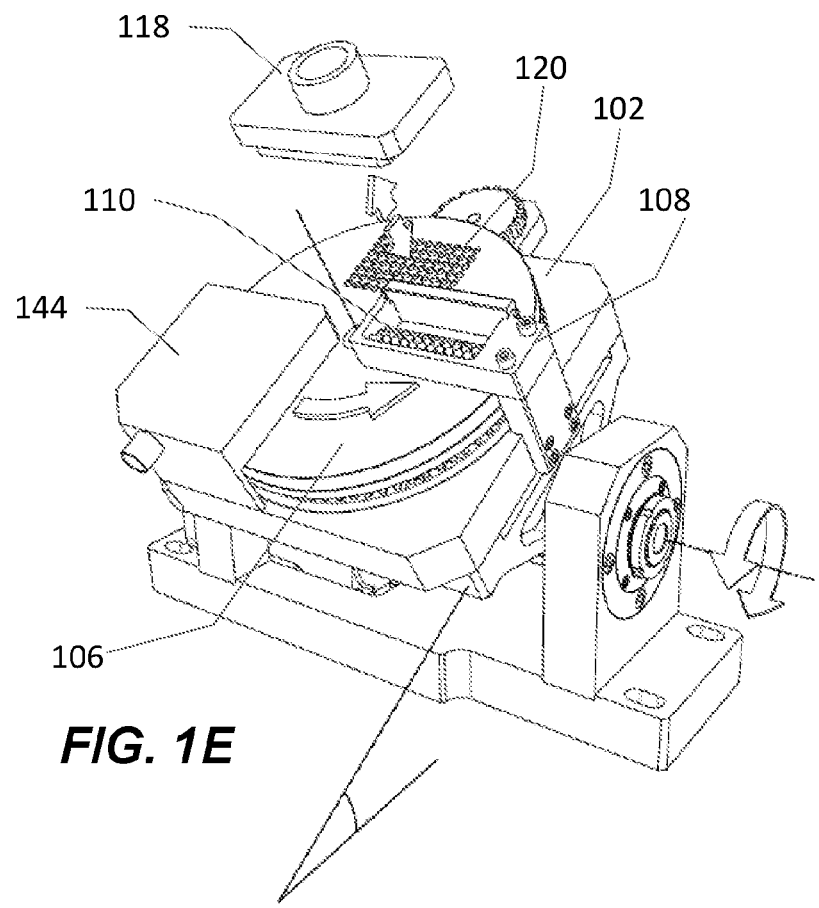
FIG. 1E shows a perspective view of the apparatus for filling a ball grid array template of FIG. 1A with a cleaning tool during the transfer of a plurality of balls according to an example embodiment.
Figure 1F:
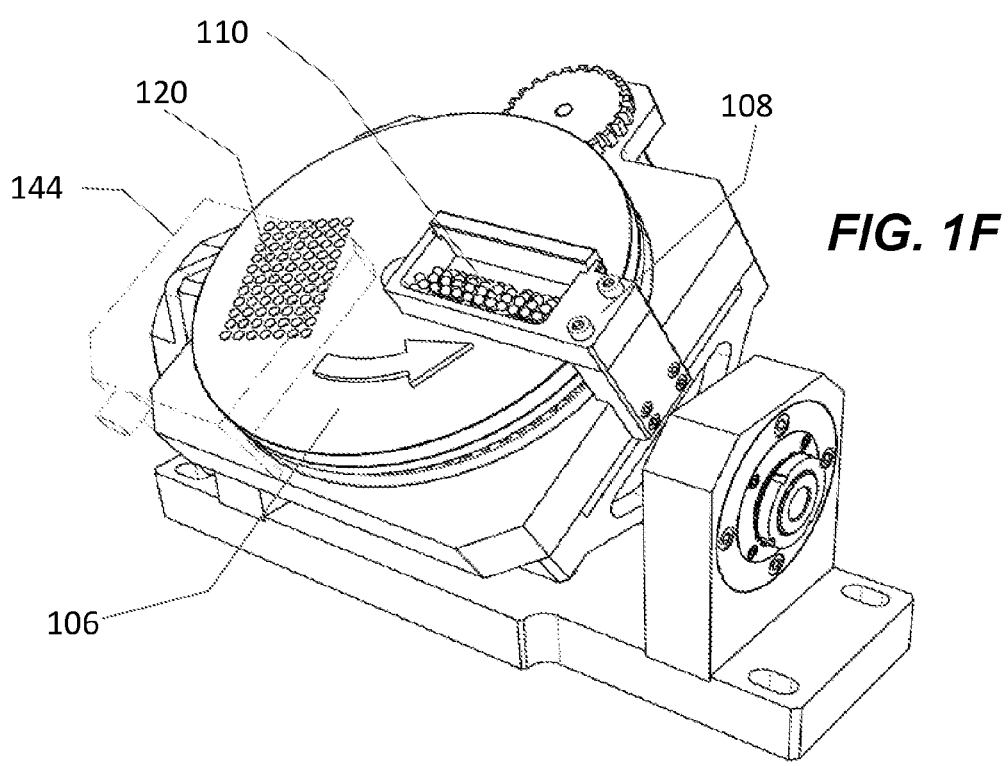
FIG. 1F shows a perspective view of the apparatus for filling a ball grid array template of FIG. 1A with a cleaning tool during the removal of impurities according to an example embodiment.

After the balls 110 are picked up, the holes 120 may be cleaned to remove dirt or impurities in an alternate embodiment. This may prevent the abnormal situation as shown in FIG. 1D and may allow the apparatus 100 to be continuously in operation. FIGS. 1E and 1F show perspective views of the apparatus 100 for filling the ball grid array template of FIG. 1A during the transfer of balls and during the removal of impurities, respectively, according to an example embodiment. As shown in the FIGS. 1E and 1F, the apparatus 100 may further include a cleaning tool 144 for removing impurities from the holes 120 after the balls 110 are picked up by the ball suction tool 118.

For example, at the position shown in FIG. 1E, the balls 110 are picked up by the ball suction tool 118 after the plurality of holes 120 are filled with balls 110 by the ball supply bin 108. Thereafter, in FIG. 1F, the plate 106 is rotated until the empty template is in a position where the cleaning tool 144 removes impurities from the empty holes 120. The plate 106 is further rotated to the position for dispensing of the balls 110 into the cleaned holes 120 and the whole operation is repeated.

Figure 2:
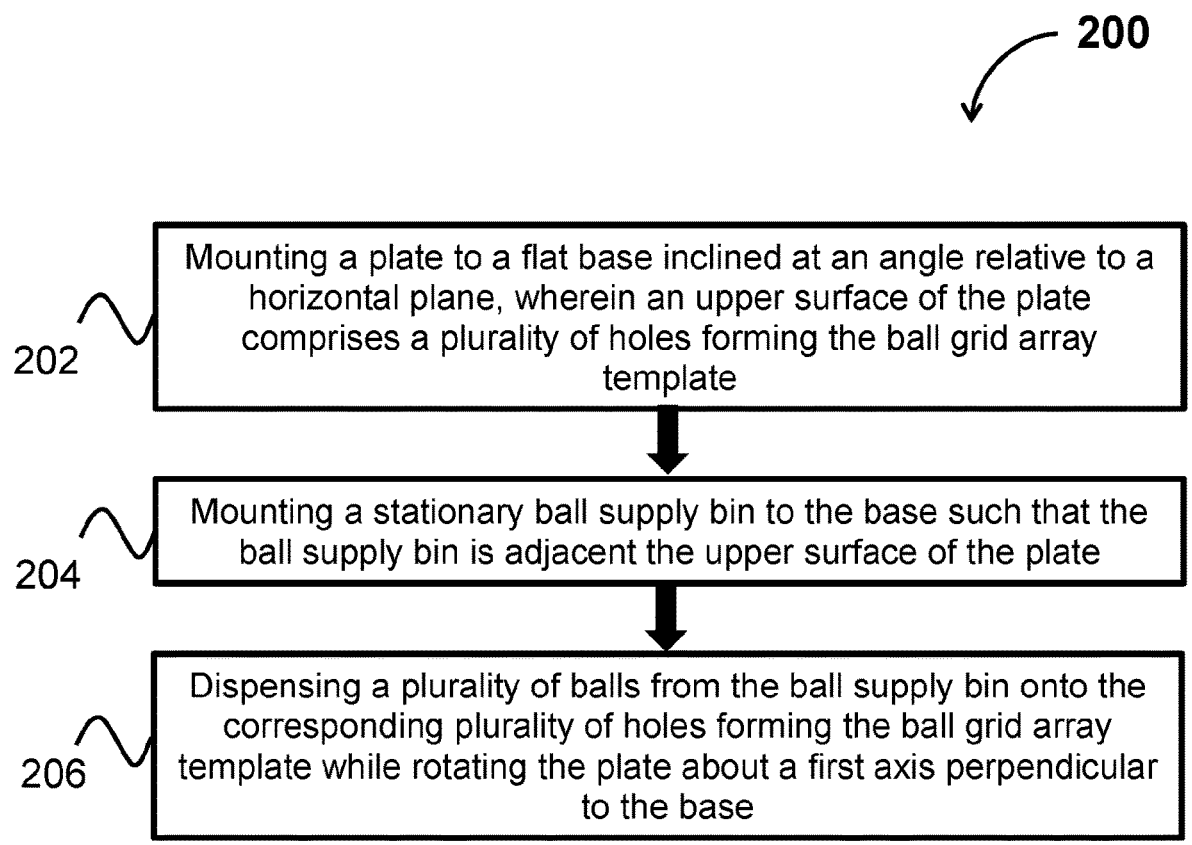
FIG. 2 shows a flowchart illustrating a method for filling a ball grid array template according to an example embodiment.

FIG. 2 shows a flowchart 200 illustrating a method for filling a ball grid array template according to an example embodiment. The method comprises, at step 202, mounting a plate to a flat base inclined at an angle relative to a horizontal plane, wherein an upper surface of the plate comprises a plurality of holes forming the ball grid array template. At step 204, the method includes mounting a stationary ball supply bin to the base such that the ball supply bin is adjacent the upper surface of the plate. At step 206, the method includes dispensing a plurality of balls from the ball supply bin onto the corresponding plurality of holes forming the ball grid array template while rotating the plate about a first axis perpendicular to the base.

Figure 3:
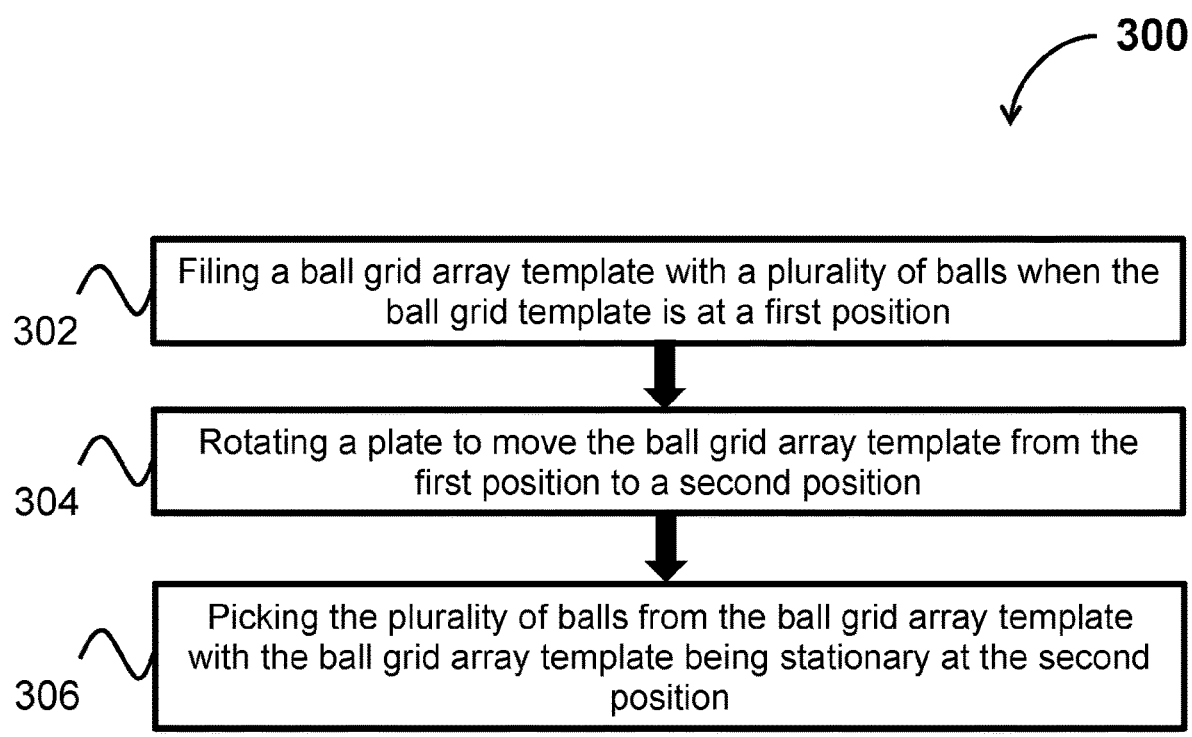
FIG. 3 shows a flowchart illustrating a method for transferring a plurality of balls according to an example embodiment.

FIG. 3 shows a flowchart 300 illustrating a method for transferring a plurality of balls according to an example embodiment. The method comprises, at step 302, filing a ball grid array template with a plurality of balls when the ball grid array template is at a first position. At step 304, the method includes rotating a plate to move the ball grid array template from the first position to a second position. At step 306, the method includes picking the plurality of balls from the ball grid array template with the ball grid array template being stationary at the second position.

As described, the example embodiments use a stationary ball supply bin and a ball grid array template moving along an inclined plane to fill the ball grid array template with solder balls. The solder balls as described in the present embodiments do not continually move across the surface of the plate in different directions. Therefore, rubbing between each of the solder balls and across the plate may be minimized and may not cause build-up of static charges. Thus it can be seen that the apparatus in accordance with the present embodiments have the advantages of high manufacturing productivity, high production yield, better solderability and electrical interconnectivity and lower yield loss. While exemplary embodiments have been presented in the foregoing detailed description of the invention, it should be appreciated that a vast number of variations exist.

It should further be appreciated that the exemplary embodiments are only examples, and are not intended to limit the scope, applicability, operation, or configuration of the invention in any way. Rather, the foregoing detailed description will provide those skilled in the art with a convenient road map for implementing an exemplary embodiment of the invention, it being understood that various changes may be made in the function and arrangement of elements and method of operation described in an exemplary embodiment without departing from the scope of the invention as set forth in the appended claims.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

The invention claimed is:

1. An apparatus for filling a ball grid array template, the apparatus comprising:
    a flat base;
    a rotatable plate mounted on the base about a first axis perpendicular to the base, an upper surface of the plate comprising a plurality of holes forming the ball grid array template; and
    a stationary ball supply bin mounted to the base,
    wherein the base is inclined at an angle relative to a horizontal plane; and
    wherein the ball supply bin is configured in use to dispense a plurality of balls onto the corresponding plurality of holes forming the ball grid array template as the plate is rotated about the first axis.

2. The apparatus as claimed in claim 1, wherein the plate comprises a first plate member mounted on the base and a second plate member coupled to the first plate member such that the first plate member rotationally drives the second plate member.

3. The apparatus as claimed in claim 2, wherein the plurality of holes are disposed on an upper surface of the second plate member.

4. The apparatus as claimed in claim 1, wherein the angle relative to the horizontal plane is adjustable based on a size of the balls and a speed of rotation of the plate.

5. The apparatus as claimed in claim 1, wherein the ball supply bin comprises an open bottom, and wherein the ball supply bin is mounted to the base such that the balls in the ball supply bin are in contact with the upper surface of the plate.

6. The apparatus as claimed in claim 1, wherein the ball supply bin further comprises a ball gate side wall having a lower end and an upper end, wherein the ball gate side wall is pivotable about a second axis adjacent the upper end, the second axis being substantially parallel to the plate.

7. The apparatus as claimed in claim 6, wherein the ball gate side wall is configured in use to detect an irregularity during dispensing of the plurality of balls onto the corresponding plurality of holes as the plate is rotated about the first axis.

8. A method for filling a ball grid array template, the method comprising:
    mounting a plate to a flat base, wherein the base is inclined at an angle relative to a horizontal plane, and wherein an upper surface of the plate comprises a plurality of holes forming the ball grid array template;
    mounting a stationary ball supply bin to the base such that the ball supply bin is adjacent the upper surface of the plate; and
    dispensing a plurality of balls from the ball supply bin onto the corresponding plurality of holes forming the ball grid array template while rotating the plate about a first axis perpendicular to the base.

9. The method as claimed in claim 8, wherein mounting the plate to the flat base comprises mounting a first plate member on the base and coupling a second plate member to the first plate member such that the first plate member rotationally drives the second plate member.

10. The method as claimed in claim 8, further comprising adjusting the angle relative to the horizontal plane based on a size of the balls and a speed of rotation of the plate.

11. The method as claimed in claim 8, wherein the ball supply bin comprises an open bottom such that the balls in the ball supply bin are in contact with the upper surface of the plate.

12. The method as claimed in claim 8, wherein the ball supply bin further comprises a ball gate side wall having a lower end and an upper end, and wherein mounting the ball supply bin to the base comprises:
    pivoting the ball gate side wall about a second axis adjacent the upper end, the second axis being parallel to the plate.

13. The method as claimed in claim 12, further comprising detecting, by the ball gate side wall, an irregularity during dispensing of the plurality of balls onto the corresponding plurality of holes as the plate is rotated about the first axis.

14. The method as claimed in claim 8, further comprising providing a vacuum to the plurality of holes for drawing and securing the plurality of balls.

15. A method for transferring a plurality of balls, the method comprising:
    filing a ball grid array template with a plurality of balls using the method as claimed in claim 8 when the ball grid array template is at a first position;
    rotating a plate to move the ball grid array template from the first position to a second position; and
    picking the plurality of balls from the ball grid array template with the ball grid array template being stationary at the second position.

16. The method as claimed in claim 15, further comprising, before picking the plurality of balls, a step of tilting the base such that the base is parallel to the horizontal plane at the second position.

17. The method as claimed in claim 15, further comprising, after picking the plurality of balls, a step of removing impurities from the plurality of holes of the ball grid array template when the ball grid array template is at a third position.

* * * * *